(12) United States Patent
Liu et al.

(10) Patent No.: US 8,513,126 B2
(45) Date of Patent: Aug. 20, 2013

(54) SLURRY COMPOSITION HAVING TUNABLE DIELECTRIC POLISHING SELECTIVITY AND METHOD OF POLISHING A SUBSTRATE

(75) Inventors: Zhendong Liu, King of Prussia, PA (US); Yi Guo, Newark, DE (US); Kancharla-Arun Kumar Reddy, Bear, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 290 days.

(21) Appl. No.: 12/887,963

(22) Filed: Sep. 22, 2010

(65) Prior Publication Data

US 2012/0070990 A1    Mar. 22, 2012

(51) Int. Cl.
*H01L 21/302* (2006.01)

(52) U.S. Cl.
USPC ........... 438/693; 438/690; 438/691; 438/692; 216/89; 252/79.1; 252/79.3; 252/79.4

(58) Field of Classification Search
None
See application file for complete search history.

(56) References Cited

U.S. PATENT DOCUMENTS

| | | | |
|---|---|---|---|
| 6,436,811 B1 * | 8/2002 | Wake et al. | 438/633 |
| 6,530,968 B2 * | 3/2003 | Tsuchiya et al. | 51/307 |
| 6,626,968 B2 | 9/2003 | Park et al. | |
| 7,018,560 B2 | 3/2006 | Liu et al. | |
| 2007/0077865 A1 | 4/2007 | Dysard et al. | |
| 2007/0184661 A1 | 8/2007 | Bian et al. | |
| 2008/0203354 A1 * | 8/2008 | Kamimura et al. | 252/79.1 |
| 2008/0220610 A1 | 9/2008 | Bayer et al. | |

OTHER PUBLICATIONS

Copending U.S. Appl. No. 12/885,748, filed Sep. 20, 2010.
Copending U.S. Appl. No. 12/432,021, filed Apr. 29, 2009.
Copending U.S. Appl. No. 12/815,564, filed Jun. 15, 2010.

* cited by examiner

*Primary Examiner* — Lan Vinh
*Assistant Examiner* — Jiong-Ping Lu
(74) *Attorney, Agent, or Firm* — Thomas S. Deibert

(57) ABSTRACT

A chemical mechanical polishing slurry composition is provided, having, as initial components: water; an abrasive, wherein the abrasive is colloidal silica abrasive; a halogenated quaternary ammonium compound according to formula (I); optionally, a diquaternary substance according to formula (II); and, optionally, a pH adjusting agent selected from phosphoric acid, nitric acid, sulfuric acid, hydrochloric acid, ammonium hydroxide and potassium hydroxide; wherein the chemical mechanical polishing slurry composition has a pH of 2 to <7. Also, provided are methods for making the chemical mechanical polishing slurry composition and for using the chemical mechanical polishing composition to polish a substrate.

9 Claims, No Drawings

SLURRY COMPOSITION HAVING TUNABLE DIELECTRIC POLISHING SELECTIVITY AND METHOD OF POLISHING A SUBSTRATE

The present invention relates generally to the field of chemical mechanical polishing. In particular, the present invention is directed to a chemical mechanical polishing slurry composition and a method for chemical mechanical polishing of semiconductor materials and, more particularly to a chemical mechanical polishing slurry composition that exhibits a tailorable removal rate and removal rate selectivity for dielectric films such as silicon oxide and $Si_3N_4$ for chemical mechanical polishing of dielectric layers from semiconductor structures in, for example, high-k metal gate, copper barrier, interlevel dielectric (ILD) and shallow trench isolation (STI) processes.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

One method used for isolating elements of a semiconductor device, referred to a shallow trench isolation (STI) process, conventionally involved use of a silicon nitride ($Si_3N_4$) layer formed on a silicon substrate, shallow trenches formed in the silicon nitride layer and a dielectric material (e.g., an oxide) is deposited to fill the trenches. Typically an excess of dielectric material is deposited on top of the substrate to ensure complete filling of the trenches. The excess dielectric material layer is then removed to expose the silicon nitride layer using chemical mechanical planarization techniques.

Past device designs emphasized chemical mechanical planarization selectivity for silicon oxide versus silicon nitride (i.e., higher removal rate for silicon oxide relative to removal rate of silicon nitride). In these device designs, the silicon nitride layer served as a stopping layer for the chemical mechanical planarization process.

Certain recent device designs demand polishing compositions that provide selectivity for silicon oxide in preference to polysilicon (i.e., higher removal rate for silicon oxide relative to the removal rate for polysilicon) for use in chemical mechanical planarization processes.

One polishing formulation for use in a chemical mechanical planarization process that provides selectivity for at least one of silicon oxide and silicon nitride relative to polysilicon is disclosed in U.S. Patent Application Publication No. 2007/0077865 to Dysard, et al. Dysard, et al. discloses a method of chemically mechanically polishing a substrate, which method comprises: (i) contacting a substrate comprising polysilicon and a material selected from silicon oxide and silicon nitride with a chemical mechanical polishing system comprising: (a) an abrasive, (b) a liquid carrier, (c) about 1 ppm to about 100 ppm, based on the weight of the liquid carrier and any components dissolved or suspended therein, of a polyethylene oxide/polypropylene oxide copolymer having an HLB of about 15 or less, and (d) a polishing pad, (ii) moving the polishing pad relative to the substrate, and (iii) abrading at least a portion of the substrate to polish the substrate.

Another polishing formulation for use in a chemical mechanical planarization process that provides selectivity for at least one of silicon oxide and silicon nitride relative to polysilicon is disclosed in U.S. Pat. No. 6,626,968 to Park, et al. Park, et al. disclose a chemical mechanical polishing composition in slurry form having a pH of 7 to 11 for simultaneously polishing a surface having a silicon oxide layer and a polysilicon layer, said slurry composition consisting essentially of water, abrasive grains selected from the group consisting of silica ($SiO_2$), alumina ($Al_2O_3$), ceria ($CeO_2$), magania ($Mn_2O_3$), and mixtures thereof, and about 0.001% to about 5% by weight of a polymer additive selected from the group consisting of poly vinyl methyl ether (PVME), poly ethylene glycol (PEG), poly oxyethylene 23 lauryl ether (POLE), poly propanoic acid (PPA), poly acrylic acid (PAA), poly ether glycol bis ether (PEGBE), and mixtures thereof wherein the polymer additive improves the selectivity ratio for removal of silicon oxide layer relative to removal of the polysilicon layer.

Notwithstanding, to support the dynamic field of device designs for use in the manufacture of semiconductor systems there exists a continued need for chemical mechanical polishing compositions formulated to provide a desirable balance of polishing properties to suit changing design needs. For example, there remains a need for chemical mechanical polishing compositions that exhibit tailorable removal rates and removal rate selectivities of dielectric films such as silicon oxide and $Si_3N_4$.

The present invention provides a chemical mechanical polishing slurry composition, comprising, as initial components: water; an abrasive; a halogenated quaternary ammonium compound according to formula (I):

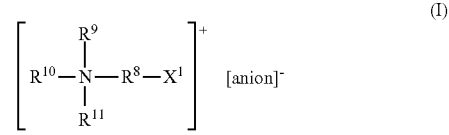

wherein $R^8$ is selected from a $C_{1-10}$ alkyl group and a $C_{1-10}$ hydroxyalkyl group; wherein $X^1$ is a halide selected from chloride, bromide, iodide and fluoride; wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl; and, wherein the anion in formula (I) can be any anion that balances the + charge on the cation in formula (I); and, optionally, a diquaternary substance according to formula (II):

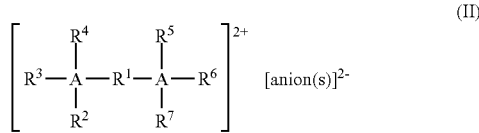

wherein each A is independently selected from N and P; wherein $R^1$ is selected from a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (II) can be any anion or combination of anions that balance the 2+ charge on the cation in formula (II).

The present invention provides a chemical mechanical polishing slurry composition, comprising, as initial components: water; 0.1 to 40 wt % of an abrasive; 0.001 to 1 wt % of a halogenated quaternary ammonium compound according to formula (I); wherein $R^8$ is selected from a $C_{1-10}$ alkyl group and a $C_{1-10}$ hydroxyalkyl group; wherein $X^1$ is a halide selected from chloride, bromide, iodide and fluoride; wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl; and, wherein the anion in formula (I) can be any anion that balances the + charge on the cation in formula (I); and, 0 to 1 wt % of a diquaternary substance according to formula (II); wherein each A is independently selected from N and P; wherein $R^1$ is selected from a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (II) can be any anion or combination of anions that balance the 2+ charge on the cation in formula (II).

The present invention provides a chemical mechanical polishing slurry composition, comprising, as initial components: water; 0.1 to 10 wt % of an abrasive; 0.002 to 0.5 wt % of the halogenated quaternary ammonium compound according to formula (I), wherein $R^8$ is selected from a —$(CH_2)_2$— group, —$CH_2CHOH$ group, —$(CH_2)_3$— group and a —$(CH_2)_2$—CHOH; wherein $X^1$ is a halide selected from chloride and bromide; wherein $R^9$, $R^{10}$ and $R^{11}$ are each independently selected from a —$CH_3$ group and a —$CH_2CH_3$ group; and, wherein the anion in formula (I) is selected from a chloride anion and a bromide anion; and, 0.002 to 0.2 wt % of the diquaternary substance according to formula (II); wherein each A is a N; $R^1$ is a —$(CH_2)_4$— group; and, wherein $R^2$, $R^3$, $R^4$, $R^5$, $R^6$ and $R^7$ are each a —$(CH_2)_3CH_3$ group.

The present invention provides a chemical mechanical polishing slurry composition, comprising, as initial components: water; 0.1 to 10 wt % of the abrasive, wherein the abrasive is a colloidal silica abrasive having an average particle size of 20 to 50 nm; 0.01 to 0.2 wt % of the halogenated quaternary ammonium compound according to formula (I), wherein $R^8$ is selected from a —$(CH_2)_2$— group, —$CH_2CHOH$ group, —$(CH_2)_3$— group and a —$(CH_2)_2$—CHOH; wherein $X^1$ is a halide selected from chloride and bromide; wherein $R^9$, $R^{10}$ and $R^{11}$ are each independently selected from a —$CH_3$ group and a —$CH_2CH_3$ group; and, wherein the anion in formula (I) is selected from a chloride anion and a bromide anion; and, 0.01 to 0.05 wt % of the diquaternary substance according to formula (II); wherein each A is a N; $R^1$ is a —$(CH_2)_4$— group; wherein $R^2$, $R^3$, $R^4$, $R^5$, $R^6$ and $R^7$ are each a —$(CH_2)_3CH_3$ group; and wherein the anion(s) that balance the 2+ charge on the cation in formula (II) is(are) selected from halide anion(s) and hydroxide anion(s).

The present invention provides a method of making the chemical mechanical polishing slurry composition, comprising: providing water; providing an abrasive; providing a halogenated quaternary ammonium compound according to formula (I); wherein $R^8$ is selected from a $C_{1-10}$ alkyl group and a $C_{1-10}$ hydroxyalkyl group; wherein $X^1$ is a halide selected from chloride, bromide, iodide and fluoride; wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl; and, wherein the anion in formula (I) can be any anion that balances the + charge on the cation in formula (I); and, optionally, providing a diquaternary substance according to formula (II); wherein each A is independently selected from N and P; wherein $R^1$ is selected from a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (II) can be any anion or combination of anions that balance the 2+ charge on the cation in formula (II); providing a pH adjusting agent; combining the water; the abrasive; the halogenated quaternary ammonium compound according to formula (I); and, the optional diquaternary substance according to formula (II) to form the chemical mechanical polishing slurry composition; and, adding the pH adjusting agent to the slurry as necessary to adjust the pH of the chemical mechanical polishing slurry composition to <7.

The present invention provides a method for chemical mechanical polishing of a substrate, comprising: providing a substrate, wherein the substrate comprises at least one of silicon oxide and $Si_3N_4$; providing a chemical mechanical polishing slurry composition according to claim 1, wherein the concentration of the halogenated quaternary ammonium compound according to formula (I) and the concentration of the optional diquaternary substance according to formula (II) is selected to tailor a removal rate exhibited by the chemical mechanical polishing slurry composition for the at least one of silicon oxide and $Si_3N_4$, providing a chemical mechanical polishing pad with a polishing surface; creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate; wherein the chemical mechanical polishing slurry composition provided has a pH of <7; wherein the substrate is polished; and wherein some of the at least one of silicon oxide and $Si_3N_4$ is removed from the substrate.

DETAILED DESCRIPTION

Selection of the specific formulation of the chemical mechanical polishing slurry composition of the present invention used in the chemical mechanical polishing method of the present invention is key to providing the target removal rate for at least one of silicon oxide, $Si_3N_4$ and polysilicon; and, preferably for providing a target removal rate selectivity between at least two of silicon oxide, $Si_3N_4$ and polysilicon (more preferably between silicon oxide and $Si_3N_4$).

Substrate suitable for use in the chemical mechanical polishing method of the present invention comprises a semiconductor substrate having at least one of silicon oxide, $Si_3N_4$ and polysilicon deposited thereon. Preferably, the substrate used will comprise at least one of silicon oxide and $Si_3N_4$. More preferably, the substrate used will have silicon oxide deposited over at least one of SiC, SiCN, $Si_3N_4$, SiCO and polysilicon (most preferably $Si_3N_4$).

Abrasives suitable for use in the chemical mechanical polishing slurry composition of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive used is a colloidal silica abrasive.

The abrasive used in the chemical mechanical polishing slurry composition of the present invention preferably has an average particle size of 5 to 200 nm; more preferably 20 to 100 nm; still more preferably 20 to 60 nm; most preferably 20 to 50 nm.

The chemical mechanical polishing slurry composition of the present invention preferably contains 0.1 to 40 wt %, more preferably 0.1 to 20 wt %, still more preferably 1 to 20 wt %, most preferably 1 to 10 wt % abrasive.

The chemical mechanical polishing slurry composition of the present invention preferably comprises a colloidal silica abrasive having an average particle size of 20 to 100 nm. Still more preferably, the chemical mechanical polishing slurry composition of the present invention, comprises: 1 to 10 wt % of a colloidal silica abrasive having an average particles size of 20 to 60 nm. Most preferably, the chemical mechanical polishing slurry composition of the present invention, comprises 1 to 10 wt % of a colloidal silica abrasive having an average particle size of 20 to 50 nm.

The water contained in the chemical mechanical polishing slurry composition of the present invention is preferably at least one of deionized and distilled to limit incidental impurities.

The chemical mechanical polishing slurry composition of the present invention comprises, as an initial component: a halogenated quaternary ammonium compound according to formula (I):

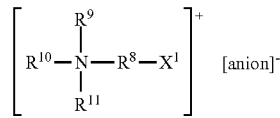

(I)

wherein $R^8$ is selected from a $C_{1-10}$ alkyl group and a $C_{1-10}$ hydroxyalkyl group (preferably wherein $R^8$ is selected from a $C_{1-5}$ alkyl group and a $C_{1-5}$ hydroxyalkyl group; more preferably wherein $R^8$ is selected from a $C_{1-4}$ alkyl group and a $C_{1-4}$ hydroxyalkyl group, most preferably wherein $R^8$ is selected from a —$(CH_2)_2$— group, —$CH_2CHOH$ group, —$(CH_2)_3$— group and a —$(CH_2)_2$—CHOH); wherein $X^1$ is a halide selected from chloride, bromide, iodide and fluoride (preferably wherein $X^1$ is selected from chloride, bromide and iodide; most preferably wherein $X^1$ is selected from chloride and bromide); wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl (preferably wherein $R^9$, $R^{10}$ and $R^{11}$ are each independently selected from a $C_{1-5}$ alkyl group and a $C_{1-5}$ haloalkyl; more preferably wherein $R^9$, $R^{10}$ and $R^{11}$ are each independently selected from a $C_{1-4}$ alkyl group; most preferably wherein $R^9$, $R^{10}$ and $R^{11}$ are each independently selected from a —$CH_3$ group and a —$CH_2CH_3$ group); and, wherein the anion in formula (I) can be any anion that balances the + charge on the cation in formula (I) (preferably the anion in formula (I) is selected from a halide anion, a hydroxide anion and a nitrite anion; more preferably a halide anion and a hydroxide anion; most preferably a halide anion selected from a chloride anion and a bromide anion). Preferably, the chemical mechanical polishing slurry composition of the present invention, comprises, as an initial component: 0.001 to 1 wt % (more preferably 0.002 to 0.5 wt %, still more preferably 0.005 to 0.2 wt %, most preferably 0.01 to 0.2 wt %) of halogenated quaternary ammonium compound according to formula (I). Most preferably, the chemical mechanical polishing slurry composition of the present invention comprises, as an initial component, 0.01 to 0.2 wt % of a halogenated quaternary ammonium compound according to formula (I) selected from (2-bromoethyl)trimethylammonium bromide; (2-chloroethyl)trimethylammonium chloride; (3-bromopropyl)trimethylammonium bromide; (3-chloroethyl)trimethylammonium chloride; (3-bromopropyl)triethylammonium bromide and (3-chloro-2-hydroxypropyl)trimethylammonium chloride. Inclusion of the halogenated quaternary ammonium compound according to formula (I), under the polishing conditions set forth in the Examples, increases the removal rate of polysilicon, silicon oxide and $Si_3N_4$; and has a tunable selectivity on the removal rates of silicon oxide and $Si_3N_4$.

The chemical mechanical polishing slurry composition of the present invention optionally comprises, as an initial component: a diquaternary substance according to formula (II):

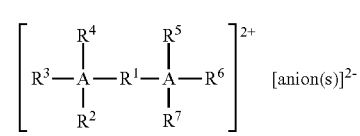

(II)

wherein each A is independently selected from N and P, preferably each A is N; wherein $R^1$ is selected from a saturated or unsaturated $C_1$-$C_{15}$ alkyl group, a $C_6$-$C_{15}$ aryl group and a $C_6$-$C_{15}$ aralkyl group (preferably a $C_2$-$C_{10}$ alkyl group; more preferably a $C_2$-$C_6$ alkyl group; still more preferably a —$(CH_2)_6$— group and a —$(CH_2)_4$— group; most preferably a —$(CH_2)_4$— group); wherein $R^2$, $R^3$, $R^4$, $R^5$, $R^6$ and $R^7$ are each independently selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_6$ alkyl group; more preferably a hydrogen and a butyl group; most preferably a butyl group); and, wherein the anion in formula (II) can be any anion or combination of anions that balance the 2+ charge on the cation in formula (II) (preferably the anion(s) in formula (II) is(are) selected from halide anions, hydroxide anions, nitrate anions, sulfate anions and phosphate anions; more preferably halide anions and hydroxide anions; most preferably hydroxide anions). The chemical mechanical polishing composition of the present invention optionally comprises, as an initial component, 0 to 1 wt % (preferably 0 to 0.5 wt %; more preferably 0.001 to 0.5 wt %, still more preferably 0.002 to 0.2 wt %, yet still more preferably 0.005 to 0.1 wt %, most preferably 0.01 to 0.05 wt %) of a diquaternary substance according to formula (II). Most preferably, the chemical mechanical polishing composition of the present invention comprises, as an initial component, 0.01 to 0.05 wt % of a diquaternary substance according to formula (II), wherein each A is N; $R^1$ is a —$(CH_2)_4$— group; and, wherein $R^2$, $R^3$, $R^4$, $R^5$, $R^6$ and $R^7$ are each a —$(CH_2)_3CH_3$ group. Inclusion of the optional diquaternary substance according to formula (II) in the chemical mechanical polishing slurry composition of the present invention provides, under the polishing conditions set forth in the Examples, an increased silicon oxide removal rate, a decreased $Si_3N_4$ removal rate and a decreased polysilicon removal rate.

The chemical mechanical polishing slurry composition of the present invention optionally further comprises additional additives selected from dispersants, surfactants, buffers and biocides.

The chemical mechanical polishing slurry composition of the present invention provides efficacy over a pH of 2 to <7. Preferably, the chemical mechanical polishing slurry composition used provides efficacy over a pH of 2 to 5. Most preferably, the chemical mechanical polishing slurry composition used provides efficacy over a pH of 2 to 4. Acids suitable for use adjusting the pH of the chemical mechanical polishing slurry composition include, for example, phosphoric acid, nitric acid, sulfuric acid and hydrochloric acid. Bases suitable for use adjusting the pH of the chemical mechanical polishing slurry composition include, for example, ammonium hydroxide and potassium hydroxide.

Preferably, the chemical mechanical polishing slurry composition of the present invention exhibits a tailorable silicon oxide removal rate, as measured under the polishing conditions set forth in the Examples, of 200 to 3,000 Å/min (preferably 300 to 2,100 Å/min).

Preferably, the chemical mechanical polishing slurry composition of the present invention exhibits a tailorable $Si_3N_4$ removal rate, as measured under the polishing conditions set forth in the Examples, of 300 to 2,000 Å/min (preferably 300 to 1,000 Å/min).

Preferably, the chemical mechanical polishing slurry composition of the present invention exhibits a tailorable removal rate selectivity, as measured under the polishing conditions set forth in the Examples, for silicon oxide to $Si_3N_4$ of 1:2 to 10:1 (more preferably 1:2 to 7:1).

Preferably, the chemical mechanical polishing slurry composition of the present invention comprises, as initial components: water; 0.1 to 40 wt % (preferably 0.1 to 20 wt %, still more preferably 1 to 20 wt %, most preferably 1 to 10 wt %) abrasive having an average particle size of 5 to 200 nm (preferably 20 to 100 nm, more preferably 20 to 60 nm, most preferably 20 to 50 nm); 0.001 to 1 wt % (more preferably 0.002 to 0.5 wt %, still more preferably 0.005 to 0.2 wt %, most preferably 0.01 to 0.2 wt %) of halogenated quaternary ammonium compound according to formula (I), wherein $R^8$ is selected from a $C_{1-10}$ alkyl group and a $C_{1-10}$ hydroxyalkyl group (preferably wherein $R^8$ is selected from a $C_{1-5}$ alkyl group and a $C_{1-5}$ hydroxyalkyl group; more preferably wherein $R^8$ is selected from a $C_{1-4}$ alkyl group and a $C_{1-4}$ hydroxyalkyl group, most preferably wherein $R^8$ is selected from a —$(CH_2)_2$— group, —$CH_2CHOH$ group, —$(CH_2)_3$— group and a —$(CH_2)_2$—CHOH); wherein $X^1$ is a halide selected from chloride, bromide, iodide and fluoride (preferably wherein $X^1$ is selected from chloride, bromide and iodide; most preferably wherein $X^1$ is selected from chloride and bromide); wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl (preferably wherein $R^9$, $R^{10}$ and $R^{11}$ are each independently selected from a $C_{1-5}$ alkyl group and a $C_{1-5}$ haloalkyl; more preferably wherein $R^9$, $R^{10}$ and $R^{11}$ are each independently selected from a $C_{1-4}$ alkyl group; most preferably wherein $R^9$, $R^{10}$ and $R^{11}$ are each independently selected from a —$CH_3$ group and a —$CH_2CH_3$ group); and, wherein the anion in formula (I) can be any anion that balances the + charge on the cation in formula (I) (preferably the anion in formula (I) is selected from a halide anion, a hydroxide anion and a nitrite anion; more preferably a halide anion and a hydroxide anion; most preferably a halide anion selected from a chloride anion and a bromide anion); 0 to 1 wt % (preferably 0 to 0.5 wt %; more preferably 0.001 to 0.5 wt %, still more preferably 0.002 to 0.2 wt %, yet still more preferably 0.005 to 0.1 wt %, most preferably 0.01 to 0.05 wt %) of a diquaternary substance according to formula (II), wherein each A is independently selected from N and P, preferably each A is N; wherein $R^1$ is selected from a saturated or unsaturated $C_1$-$C_{15}$ alkyl group, a $C_6$-$C_{15}$ aryl group and a $C_6$-$C_{15}$ aralkyl group (preferably a $C_2$-$C_{10}$ alkyl group; more preferably a $C_2$-$C_6$ alkyl group; still more preferably a —$(CH_2)_6$— group and a —$(CH_2)_4$— group; most preferably a —$(CH_2)_4$— group); wherein $R^2$, $R^3$, $R^4$, $R^5$, $R^6$ and $R^7$ are each independently selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_6$ alkyl group; more preferably a hydrogen and a butyl group; most preferably a butyl group); and, wherein the anion in formula (II) can be any anion or combination of anions that balance the 2+ charge on the cation in formula (II) (preferably the anion(s) in formula (II) is(are) selected from halide anions, hydroxide anions, nitrate anions, sulfate anions and phosphate anions; more preferably halide anions and hydroxide anions; most preferably hydroxide anions).

The chemical mechanical polishing method of the present invention comprises: providing a substrate, wherein the substrate comprises at least one of silicon oxide and $Si_3N_4$; providing a chemical mechanical polishing slurry composition according to the present invention, wherein the chemical mechanical polishing slurry composition comprises, as initial components: water, 0.1 to 40 wt % (preferably 0.1 to 20 wt %, most preferably 1 to 10 wt %) abrasive having an average particle size of 5 to 200 nm (preferably 20 to 60 nm, most preferably 20 to 50 nm); 0.001 to 1 wt % (more preferably 0.002 to 0.5 wt %, still more preferably 0.005 to 0.2 wt %, most preferably 0.01 to 0.2 wt %) of halogenated quaternary ammonium compound according to formula (I), wherein $R^8$ is selected from a $C_{1-10}$ alkyl group and a $C_{1-10}$ hydroxyalkyl group (preferably wherein $R^8$ is selected from a $C_{1-5}$ alkyl group and a $C_{1-5}$ hydroxyalkyl group; more preferably wherein $R^8$ is selected from a $C_{1-4}$ alkyl group and a $C_{1-4}$ hydroxyalkyl group, most preferably wherein $R^8$ is selected from a —$(CH_2)_2$— group, —$CH_2CHOH$ group, —$(CH_2)_3$— group and a —$(CH_2)_2$—$CHOH$); wherein $X^1$ is a halide selected from chloride, bromide, iodide and fluoride (preferably wherein $X^1$ is selected from chloride, bromide and iodide; most preferably wherein $X^1$ is selected from chloride and bromide); wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl (preferably wherein $R^9$, $R^{10}$ and $R^{11}$ are each independently selected from a $C_{1-5}$ alkyl group and a $C_{1-5}$ haloalkyl; more preferably wherein $R^9$, $R^{10}$ and $R^{11}$ are each independently selected from a $C_{1-4}$ alkyl group; most preferably wherein $R^9$, $R^{10}$ and $R^{11}$ are each independently selected from a —$CH_3$ group and a —$CH_2CH_3$ group); and, wherein the anion in formula (I) can be any anion that balances the + charge on the cation in formula (I) (preferably the anion in formula (I) is selected from a halide anion, a hydroxide anion and a nitrite anion; more preferably a halide anion and a hydroxide anion; most preferably a halide anion selected from a chloride anion and a bromide anion); 0 to 1 wt % (preferably 0 to 0.5 wt %; more preferably 0.001 to 0.5 wt %, still more preferably 0.002 to 0.2 wt %, yet still more preferably 0.005 to 0.1 wt %, most preferably 0.01 to 0.05 wt %) of a diquaternary substance according to formula (II), wherein each A is independently selected from N and P, preferably each A is N; wherein $R^1$ is selected from a saturated or unsaturated $C_1$-$C_{15}$ alkyl group, a $C_6$-$C_{15}$ aryl group and a $C_6$-$C_{15}$ aralkyl group (preferably a $C_2$-$C_{10}$ alkyl group; more preferably a $C_2$-$C_6$ alkyl group; still more preferably a —$(CH_2)_6$— group and a —$(CH_2)_4$— group; most preferably a —$(CH_2)_4$— group); wherein $R^2$, $R^3$, $R^4$, $R^5$, $R^6$ and $R^7$ are each independently selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_6$ alkyl group; more preferably a hydrogen and a butyl group; most preferably a butyl group); and, wherein the anion in formula (II) can be any anion or combination of anions that balance the 2+ charge on the cation in formula (II) (preferably the anion(s) in formula (II) is(are) selected from halide anions, hydroxide anions, nitrate anions, sulfate anions and phosphate anions; more preferably halide anions and hydroxide anions; most preferably hydroxide anions); wherein the concentration of the halogenated quaternary ammonium compound according to formula (I) and the concentration of the optional diquaternary substance according to formula (II) is selected to tailor a removal rate exhibited by the chemical mechanical polishing slurry composition for the at least one of silicon oxide and $Si_3N_4$; providing a chemical mechanical polishing pad with a polishing surface; creating dynamic contact at an interface between the polishing surface of the chemical mechanical polishing pad and the substrate with a down force of 0.69 to 34.5 kPa (0.1 to 5 psi), preferably 0.69 to 20.7 kPa (0.1 to 3 psi); and dispensing the chemical mechanical polishing slurry composition onto the chemical mechanical polishing pad at or near the interface between the chemical mechanical polishing pad and the substrate; wherein the chemical mechanical polishing slurry composition provided has a pH of <7 (preferably of 2 to <7; more preferably of 2 to 5; most preferably of 2 to 4); wherein the substrate is polished; wherein some of the at least one of silicon oxide and $Si_3N_4$ is removed from the substrate.

Preferably, the chemical mechanical polishing method of the present invention comprises: providing a substrate, wherein the substrate comprises at least one of silicon oxide and $Si_3N_4$; providing water; providing a chemical mechanical polishing slurry composition, comprising, as initial components: 0.1 to 10 wt % of the abrasive, wherein the abrasive is a colloidal silica abrasive having an average particle size of 20 to 50 nm; 0.01 to 0.2 wt % of the halogenated quaternary ammonium compound according to formula (I), wherein $R^8$ is selected from a —$(CH_2)_2$— group, —$CH_2CHOH$ group, —$(CH_2)_3$— group and a —$(CH_2)_2$—$CHOH$); wherein $X^1$ is a halide selected from chloride and bromide; wherein $R^9$, $R^{10}$ and $R^{11}$ are each independently selected from a —$CH_3$ group and a —$CH_2CH_3$ group; and, wherein the anion in formula (I) is selected from a chloride anion and a bromide anion; and, 0 to 0.05 wt % of the diquaternary substance according to formula (II); wherein each A is a N; $R^1$ is a —$(CH_2)_4$— group; and, wherein $R^2$, $R^3$, $R^4$, $R^5$, $R^6$ and $R^7$ are each a —$(CH_2)_3CH_3$ group; providing a chemical mechanical polishing pad with a polishing surface; creating dynamic contact at an interface between the polishing surface of the chemical mechanical polishing pad and the substrate with a down force of 0.69 to 34.5 kPa (0.1 to 5 psi), preferably 0.69 to 20.7 kPa (0.1 to 3 psi); and dispensing the chemical mechanical polishing slurry composition onto the chemical mechanical polishing pad at or near the interface between the chemical mechanical polishing pad and the substrate; wherein the chemical mechanical polishing slurry composition provided has a pH of <7 (preferably of 2 to <7; more preferably of 2 to 5; most preferably of 2 to 4); wherein the substrate is polished; wherein some of the at least one of silicon oxide and $Si_3N_4$ is removed from the substrate.

Some embodiments of the present invention will now be described in detail in the following Examples.

Comparative Example C1 and Examples A1-A6

Chemical Mechanical Polishing Slurry Composition Preparation

The chemical mechanical polishing slurry compositions used in the Comparative Polishing Example PC1 and Polishing Examples PA1-PA6 (namely chemical mechanical polishing slurry compositions C1 and A1-A6, respectively) were prepared by combining the components in the amounts listed in Table 1 with the balance being deionized water and adjusting the pH of the compositions to the final pH listed in Table 1 with nitric acid.

TABLE 1

| Ex # | Abrasive I* (wt %) | Abrasive II£ (wt %) | Compound formula (I) (wt %)¥ | Compound formula (II) (wt %)€ | pH |
|---|---|---|---|---|---|
| C1 | 5 | 1 | — | — | 3.0 |
| A1 | 5 | 1 | 0.02 | — | 3.0 |
| A2 | 5 | 1 | 0.05 | — | 3.0 |
| A3 | 5 | 1 | 0.08 | — | 3.0 |
| A4 | 5 | 1 | 0.12 | — | 3.0 |

TABLE 1-continued

| Ex # | Abrasive I* (wt %) | Abrasive II£ (wt %) | Compound formula (I) (wt %)¥ | Compound formula (II) (wt %)€ | pH |
|---|---|---|---|---|---|
| A5 | 5 | 1 | 0.15 | — | 3.0 |
| A6 | 5 | 1 | 0.08 | 0.03 | 3.0 |

*Abrasive I--Klebosol ™ II 1598-B25 slurry manufactured by AZ Electronic Materials, available from The Dow Chemical Company.
£Abrasive II--Klebosol ™ II 30H50i slurry manufactured by AZ Electronic Materials, available from The Dow Chemical Company.
¥(3-chloro-2-hydroxypropyl)trimethylammonium chloride available from Sigma-Aldrich, Inc.
€HBBAH: N,N,N,N',N',N'-hexabutyl-1,4-butanediammonium dihydroxide from Sachem, Inc.:

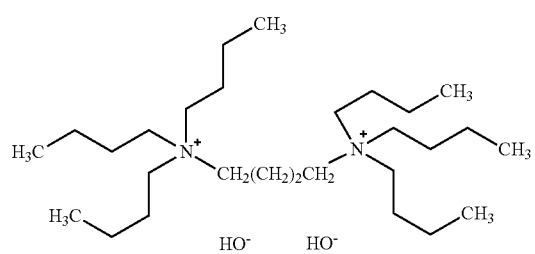

Comparative Example PC1 and Examples PA1-PA6

Chemical Mechanical Polishing Removal Rate Experiments

Silicon oxide, $Si_3N_4$, and polysilicon removal rate polishing tests were performed using the chemical mechanical polishing slurry compositions prepared according to Comparative Example C1 and Examples A1-A6. Specifically, the silicon oxide, $Si_3N_4$ and polysilicon removal rate for each of the chemical mechanical polishing slurry compositions C1 and A1-A6 as identified in Table 1. The polishing removal rate experiments were performed on eight inch blanket wafers. A Strasbaugh nSpire™ CMP system model 6EC rotary type polishing platform was used for Example PC1 and an Applied Materials Mirra® polisher was used for Examples PA1-PA6. All polishing experiments were performed using an IC1010™ polyurethane polishing pad (commercially available from Rohm and Haas Electronic Materials CMP Inc.) with a down force of 20.7 kPa (3 psi), a chemical mechanical polishing slurry composition flow rate of 200 ml/min, a table rotation speed of 93 rpm and a carrier rotation speed of 87 rpm. The removal rates were determined by measuring the film thickness before and after polishing using a KLA-Tencor FX200 metrology tool. The results of the removal rate experiments are provided in Table 2.

TABLE 2

| Ex # | Slurry Composition | $SiO_2$ removal rate (Å/min) | $Si_3N_4$ removal rate (Å/min) | Polysilicon removal rate (Å/min) |
|---|---|---|---|---|
| PC1 | C1 | 233 | 621 | 810 |
| P1 | A1 | 340 | 688 | 1248 |
| P2 | A2 | 540 | 768 | 1397 |
| P3 | A3 | 865 | 807 | 1362 |
| P4 | A4 | 1143 | 845 | 1303 |
| P5 | A5 | 1244 | 832 | 1268 |
| P6 | A6 | 2068 | 323 | 1088 |

We claim:

1. A chemical mechanical polishing slurry composition, consisting of, as initial components:
    water;
    an abrasive, wherein the abrasive is a colloidal silica abrasive;
    a halogenated quaternary ammonium compound according to formula (I):

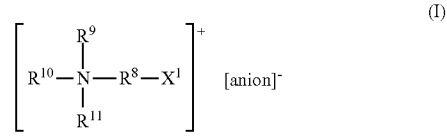

wherein $R^8$ is selected from a $C_{1-10}$ alkyl group and a $C_{1-10}$ hydroxyalkyl group; wherein $X^1$ is a halide selected from chloride, bromide, iodide and fluoride; wherein $R^9$, $R^{10}$ and $R^{11}$ are each independently selected from a saturated or unsaturated $C_{1-10}$ alkyl group, a $C_{1-10}$ haloalkyl group, a $C_{6-15}$ aryl group, a $C_{6-15}$ haloaryl group, a $C_{6-15}$ arylalkyl group and a $C_{6-15}$ haloarylalkyl; and, wherein the anion in formula (I) can be any anion that balances the + charge on the cation in formula (I);
    optionally, a diquaternary substance according to formula (II):

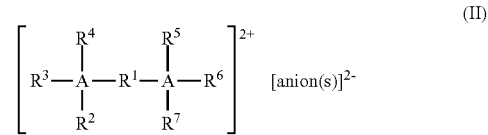

wherein each A is independently selected from N and P; wherein $R^1$ is selected from a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (II) can be any anion or combination of anions that balance the 2+ charge on the cation in formula (II); and,
    optionally, a pH adjusting agent selected from phosphoric acid, nitric acid, sulfuric acid, hydrochloric acid, ammonium hydroxide and potassium hydroxide;
    wherein the chemical mechanical polishing slurry composition has a pH of 2 to <7.

2. The chemical mechanical polishing slurry composition of claim 1, wherein the chemical mechanical polishing slurry composition consists of, as initial components:
    water;
    0.1 to 40 wt % of the colloidal silica abrasive;
    0.001 to 1 wt % of the halogenated quaternary ammonium compound according to formula (I);
    0 to 1 wt % of the diquaternary substance according to formula (II); and,
    optionally, a pH adjusting agent selected from phosphoric acid, nitric acid, sulfuric acid, hydrochloric acid, ammonium hydroxide and potassium hydroxide.

3. The chemical mechanical polishing slurry composition of claim 1, wherein the chemical mechanical polishing slurry composition consists of, as initial components:

water;

0.1 to 10 wt % of the colloidal silica abrasive;

0.002 to 0.5 wt % of the halogenated quaternary ammonium compound according to formula (I), wherein $R^8$ is selected from a —$(CH_2)_2$— group, —$CH_2CHOC$ group, —$(CH_2)_3$— group and a —$(CH_2)_2$—CHOH; wherein $X^1$ is a halide selected from chloride and bromide; wherein $R^9$, $R^{10}$ and $R^{11}$ are each independently selected from a —$CH_3$ group and a —$CH_2CH_3$ group; and, wherein the anion in formula (I) is selected from a chloride anion and a bromide anion;

0.002 to 0.2 wt % of the diquaternary substance according to formula (II); wherein each A is a N; $R^1$ is a —$(CH_2)_4$— group; and, wherein $R^2$, $R^3$, $R^4$, $R^5$, $R^6$ and $R^7$ are each a —$(CH_2)_2CH_3$ group; and, optionally, a pH adjusting agent selected from phosphoric acid, nitric acid, sulfuric acid, hydrochloric acid, ammonium hydroxide and potassium hydroxide.

4. The chemical mechanical polishing slurry composition of claim 1, wherein the chemical mechanical polishing slurry composition consists of, as initial components:

water;

0.1 to 10 wt % of the colloidal silica abrasive, wherein the colloidal silica abrasive has an average particle size of 20 to 50 nm;

0.01 to 0.2 wt % of the halogenated quaternary ammonium compound according to formula (I), wherein $R^8$ is selected from a —$(CH_2)_2$— group, —$CH_2CHOH$ group, —$(CH_2)_3$— group and at —$(CH_2)_2$—CHOH; wherein $X^1$ is a halide selected from chloride and bromide; wherein $R^9$, $R^{10}$ and $R^{11}$ are each independently selected from a —$CH_3$ group and a —$CH_2CH_3$ group; and, wherein the anion in formula (I) is selected from a chloride anion and a bromide anion;

0.01 to 0.05 wt % of the diquaternary substance according to formula (II); wherein each A is a N; $R^1$ is a —$(CH_2)_4$— group; wherein $R^2$, $R^3$, $R^4$, $R^5$, $R^6$ and $R^7$ are each a —$(CH_2)_3CH_3$ group; and wherein the anion(s) that balance the 2+ charge on the cation in formula (II) is(are) selected from halide anion(s) and hydroxide anion(s); and optionally, a pH adjusting agent selected from phosphoric acid, nitric acid, sulfuric acid, hydrochloric acid, ammonium hydroxide and potassium hydroxide.

5. A method for chemical mechanical polishing of a substrate, comprising:

providing a substrate, wherein the substrate comprises at least one of silicon oxide and $Si_3N_4$;

providing a chemical mechanical polishing slurry composition according to claim 1, wherein the concentration of the halogenated quaternary ammonium compound according to formula (I) and the concentration of the optional diquaternary substance according to formula (II) is selected to tailor a removal rate exhibited by the chemical mechanical polishing slurry composition for the at least one of silicon oxide and $Si_3N_4$;

providing a chemical mechanical polishing pad with a polishing surface;

creating dynamic contact at an interface between the polishing surface of the chemical mechanical polishing pad and the substrate with a down force of 0.69 to 34.5 kPa; and dispensing the chemical mechanical polishing slurry composition onto the chemical mechanical polishing pad at or near the interface between the chemical mechanical polishing pad and the substrate;

wherein the chemical mechanical polishing slurry composition provided has a pH of <7;

wherein the substrate is polished; and, wherein some of the at least one of silicon oxide and $Si_3N_4$ is removed from the substrate.

6. The method of claim 5, wherein the chemical mechanical polishing slurry composition provided contains, as initial components:

water;

0.1 to 10 wt % of the abrasive, wherein the abrasive is a colloidal silica abrasive having an average particle size of 20 to 50 nm;

0.01 to 0.2 wt % of the halogenated quaternary ammonium compound according to formula (I), wherein $R^8$ is selected from a —$(CH_2)_2$— group, —$CH_2CHOH$ group, —$(CH_2)_3$— group;

wherein $X^1$ is a halide selected from chloride and bromide; wherein $R^9$, $R^{10}$ and $R^{11}$ are each independently selected from a —$CH_3$ group and a —$CH_2CH_3$ group; and, wherein the anion in formula (I) is selected from a chloride anion and a bromide anion; and, 0.01 to 0.05 wt % of the diquaternary substance according to formula (II); wherein each A is a N; $R^1$ is a —$(CH_2)_4$— group; and, wherein $R^2$, $R^3$, $R^4$, $R^5$, $R^6$ and $R^7$ are each a —$(CH_2)_3CH_3$ group; and wherein the chemical mechanical polishing slurry composition provided has a pH of 2 to 4.

7. The method of claim 6, wherein the substrate comprises silicon oxide and wherein the chemical mechanical polishing slurry composition is tailored to exhibit a silicon oxide removal rate of 200 to 3,000 Å/min.

8. The method of claim 6, wherein the substrate comprises $Si_3N_4$ and wherein the chemical mechanical polishing slurry composition is tailored to exhibit a $Si_3N_4$ removal rate or 300 to 2,000 Å/min.

9. The method of claim 6, wherein the substrate comprises both silicon oxide and $Si_3N_4$ and wherein the chemical mechanical polishing slurry composition is tailored to exhibit a removal rate selectivity for silicon oxide to $Si_3N_4$ of 1:2 to 10:1.

* * * * *